United States Patent [19]

Kimura et al.

[11] Patent Number: 5,790,495
[45] Date of Patent: Aug. 4, 1998

[54] DATA GENERATOR ASSEMBLY FOR RETRIEVING STORED DATA BY COMPARING THRESHOLD SIGNAL WITH PREPROCESSED SIGNAL HAVING DC COMPONENT

[75] Inventors: Noboru Kimura, Torrance; Wen-Yung Yeh, Agoura Hills, both of Calif.

[73] Assignee: Discovision Associates, Irvine, Calif.

[21] Appl. No.: 690,019

[22] Filed: Jul. 31, 1996

Related U.S. Application Data

[63] Continuation of Ser. No. 238,831, May 6, 1994, abandoned.

[51] Int. Cl.$^6$ .................................................... G11B 7/00
[52] U.S. Cl. ................................ 369/59; 369/124
[58] Field of Search ........................ 360/59, 77.02, 360/77.13, 77.14, 77.15, 39, 40; 369/59, 47, 48, 49, 109, 124, 100, 13; 395/440; 341/132; 327/557; 358/330

[56] References Cited

U.S. PATENT DOCUMENTS

| | | | |
|---|---|---|---|
| Re. 32,051 | 12/1985 | Ceshkovsky et al. | 369/59 |
| Re. 32,431 | 6/1987 | Dakin et al. | 358/338 |
| Re. 32,574 | 1/1988 | Ceshkovsky et al. | 369/32 |
| Re. 32,709 | 7/1988 | Ceshkovsky et al. | 369/59 |
| 3,518,442 | 6/1970 | Johnson | 369/58 |
| 3,530,258 | 9/1970 | Gregg et al. | 369/58 |
| 3,638,037 | 1/1972 | McMurtrie | 327/557 |
| 3,772,604 | 11/1973 | Hogg et al. | 328/169 |
| 4,190,860 | 2/1980 | Somers et al. | 358/128.5 |
| 4,210,931 | 7/1980 | Bailey et al. | 358/128.5 |
| 4,222,072 | 9/1980 | Bailey et al. | 358/128.5 |
| 4,225,873 | 9/1980 | Winslow | 346/76 |
| 4,232,201 | 11/1980 | Canino | 358/128.5 |
| 4,232,337 | 11/1980 | Winslow et al. | 358/128.5 |
| 4,241,455 | 12/1980 | Eibner | 455/600 |
| 4,282,598 | 8/1981 | Elliott | 369/44.42 |
| 4,358,796 | 11/1982 | Ceshkovsky et al. | 358/322 |
| 4,370,679 | 1/1983 | Ceshkovsky et al. | 358/318 |
| 4,371,899 | 2/1983 | Ceshkovsky et al. | 358/315 |
| 4,375,091 | 2/1983 | Dakin et al. | 369/32 |
| 4,406,000 | 9/1983 | Shoji et al. | 369/44.41 |

(List continued on next page.)

FOREIGN PATENT DOCUMENTS

| | | |
|---|---|---|
| 833100 | 1/1970 | Canada . |
| 51343 | 5/1982 | European Pat. Off. . |
| 0064196 | 11/1982 | European Pat. Off. . |
| 0265849 | 5/1988 | European Pat. Off. . |
| 0320975 | 6/1989 | European Pat. Off. . |
| 0388271 | 9/1990 | European Pat. Off. . |
| 466329 | 1/1992 | European Pat. Off. . |
| 60-070552 | 4/1985 | Japan . |
| 60-197908 | 10/1985 | Japan . |
| 63-069067 | 3/1988 | Japan . |
| 1628236 | 12/1991 | Japan . |
| 1670392 | 6/1992 | Japan . |

OTHER PUBLICATIONS

H. Ide et al., *Write Control Method for High Density Magneto Optical Disk System* (presentation given in Jul. of 1993).

*Primary Examiner*—Nabil Hindi
*Attorney, Agent, or Firm*—Ronald J. Clark; Robert T. Braun; Paul M. Thyfault

[57] ABSTRACT

A data generator assembly for use in retrieving stored data from an information storage medium. The data generator assembly includes a positive peak detector for receiving a preprocessed signal having a predetermined waveform including positive peaks, negative peaks, and a DC component. The positive peak detector is utilized to measure and track the positive peaks to output a positive peak signal. A negative peak detector measures and tracks the negative peaks to output a negative peak signal. The data generator assembly also includes a voltage divider for averaging the negative peak signal and the positive peak signal and generating a threshold signal representing the approximate peak-to-peak midpoint of the preprocessed signal which varies with the DC component. A comparator is provided for comparing the preprocessed signal with the threshold signal. The comparator generates an output data waveform signal indicative of the stored data on information storage medium.

15 Claims, 13 Drawing Sheets

U.S. PATENT DOCUMENTS

| | | | |
|---|---|---|---|
| 4,414,655 | 11/1983 | Shoji et al. | 369/44.41 |
| 4,439,848 | 3/1984 | Ceshkovsky et al. | 369/59 |
| 4,451,913 | 5/1984 | Elliott | 369/58 |
| 4,456,914 | 6/1984 | Winslow | 369/32 |
| 4,467,467 | 8/1984 | Wilkinson et al. | 369/59 |
| 4,488,279 | 12/1984 | Wilkinson et al. | 369/54 |
| 4,499,569 | 2/1985 | Lopez De Romana . | |
| 4,499,570 | 2/1985 | Immink et al. | 369/48 |
| 4,536,863 | 8/1985 | Giddings | 369/43 |
| 4,550,346 | 10/1985 | Hatano | 358/330 |
| 4,571,716 | 2/1986 | Szerlip | 369/54 |
| 4,583,210 | 4/1986 | Winslow | 369/54 |
| 4,611,318 | 9/1986 | Winslow | 369/54 |
| 4,638,377 | 1/1987 | Dakin | 358/343 |
| 4,701,898 | 10/1987 | Giddings | 369/110 |
| 4,703,368 | 10/1987 | Dakin | 346/76 |
| 4,703,467 | 10/1987 | Elliott | 369/111 |
| 4,706,133 | 11/1987 | Giddings | 369/58 |
| 4,724,496 | 2/1988 | White . | |
| 4,727,433 | 2/1988 | Dakin | 369/47 |
| 4,727,532 | 2/1988 | Giddings | 369/54 |
| 4,751,692 | 6/1988 | Giddings | 369/54 |
| 4,757,393 | 7/1988 | Dakin et al. | 369/59 |
| 4,774,699 | 9/1988 | Giddings | 369/44.41 |
| 4,809,247 | 2/1989 | Elliott | 369/32 |
| 4,811,280 | 3/1989 | Berkowitz et al. | 395/440 |
| 4,845,697 | 7/1989 | Giddings | 369/32 |
| 4,890,275 | 12/1989 | Mori . | |
| 4,928,187 | 5/1990 | Rees | 360/40 |
| 4,972,276 | 11/1990 | Wadaya et al. | 360/66 |
| 4,975,897 | 12/1990 | Tanahashi . | |
| 4,998,011 | 3/1991 | Shuman | 369/44.23 |
| 5,003,526 | 3/1991 | Bailey | 369/59 |
| 5,084,852 | 1/1992 | Bailey | 369/59 |
| 5,099,464 | 3/1992 | Maeda | 369/13 |
| 5,101,395 | 3/1992 | Cardero et al. | 369/59 |
| 5,109,373 | 4/1992 | Ohno et al. | 369/100 |
| 5,136,558 | 8/1992 | Getreuer et al. | 369/44.15 |
| 5,155,633 | 10/1992 | Grove et al. | 359/834 |
| 5,159,340 | 10/1992 | Smith | 341/132 |
| 5,166,914 | 11/1992 | Shimada et al. . | |
| 5,177,640 | 1/1993 | Grassens | 359/814 |
| 5,192,922 | 3/1993 | Jordan . | |
| 5,204,848 | 4/1993 | Cardero et al. | 369/126 |
| 5,233,589 | 8/1993 | Saito et al. . | |
| 5,241,524 | 8/1993 | Lee . | |
| 5,245,174 | 9/1993 | Prikryl et al. | 250/201.5 |
| 5,253,244 | 10/1993 | Bailey | 369/59 |
| 5,289,455 | 2/1994 | Kuroda et al. | 369/59 |
| 5,303,217 | 4/1994 | Bakx et al. | 369/48 |
| 5,313,332 | 5/1994 | Schell et al. | 369/44.15 |
| 5,321,680 | 6/1994 | Bailey | 369/59 |
| 5,327,411 | 7/1994 | Iwasa et al. . | |
| 5,331,622 | 7/1994 | Ernst et al. | 369/112 |
| 5,349,175 | 9/1994 | Prikryl | 369/44.31 |
| 5,355,356 | 10/1994 | Johann et al. . | |
| 5,355,359 | 10/1994 | Johann et al. | 369/59 |
| 5,373,490 | 12/1994 | Bailey | 369/59 |
| 5,375,116 | 12/1994 | Bailey | 369/275.3 |
| 5,396,479 | 3/1995 | Johann | 369/275.3 |
| 5,400,318 | 3/1995 | Nakayama et al. | 369/59 |
| 5,448,544 | 9/1995 | Tsuchinaga et al. | 360/66 |
| 5,448,545 | 9/1995 | Bailey | 369/47 |
| 5,450,389 | 9/1995 | Hayashi | 369/59 |
| 5,479,390 | 12/1995 | Bailey | 369/59 |
| 5,491,681 | 2/1996 | Klein et al. | 369/124 |
| 5,497,361 | 3/1996 | Mita et al. . | |
| 5,537,383 | 7/1996 | Gage et al. . | |

DATA GENERATOR ASSEMBLY FOR RETRIEVING STORED DATA BY COMPARING THRESHOLD SIGNAL WITH PREPROCESSED SIGNAL HAVING DC COMPONENT

CROSS-REFERENCE TO RELATED APPLICATIONS

This application is a continuation of U.S. patent application Ser. No. 08/238,831 filed May 6, 1994, now abandoned.

FIELD OF THE INVENTION

This invention relates to storage and retrieval of data stored on various magnetic, optical or electronic media and, more particularly, to a method and apparatus for storing and retrieving data in a magneto-optical disk system.

BACKGROUND OF THE INVENTION

Various types of recordable and/or erasable media have been used for many years for data storage purposes. Examples of such media include, magnetic tapes and disks, as well as various types of optical media including magneto-optical disks.

Magneto-optical ("MO") systems exist for recording data on and retrieving data from a magneto-optical disk. The process of recording in a magneto-optical system typically involves use of a magnetic field to orient the polarity of a generalized area on the disk while a laser pulse heats a localized area, thereby fixing the polarity of the localized area. The localized area with fixed polarity is commonly called a pit or mark. Some encoding systems use the existence or absence of a pit or mark on the disk to define the recorded data as a "1" or "0", respectively.

When recording data, a binary input data sequence may be converted by digital modulation to a different binary sequence having more desirable properties. A modulator may, for example, convert m data bits to a code word with n modulation code bits (or "binits"). In most cases, there are more code bits than data bits - - - i.e., m<n.

Most if not all disk drive systems use run-length-limited ("RLL") modulation codes, such as RLL 2/7 or RLL 2/7/1/2 codes. Another family of modulation codes are group-coded recording ("GCR") codes, such as GCR 8/9 or GCR 0/3/8/9 codes. The numbers appended to the names of particular codes typically refer to certain encoding constraints, such the relationship between bits and flux reversals, or the minimum and maximum number of contiguous binits possible without flux transitions. For example, a commonly used encoding system for pit-type recording is the RLL 2/7 code which constrains the recorded information to have a minimum of two and a maximum of seven zeroes between ones. In general, RLL recording provides a relatively high data-to-pit ratio but may not, however, in many circumstances allow for high data storage densities because amplitude and timing margins deteriorate very rapidly as frequency is increased.

A GCR 8/9 code, on the other hand, requires nine flux reversals for every eight data bits. The GCR 0/3/8/9 code imposes the same constraints as the GCR 8/9 code but further requires a minimum of no zeroes and a maximum of three zeroes between ones.

The density ratio of a given recording system is often expressed according to the equation $(m/n) \times (d+1)$, where m and n have the definitions provided above, and d is defined as the minimum number of zeroes occurring between ones.

Thus, the RLL 2/7/1/2 code has, according to the above equation, a density ratio of 1.5, while the GCR 0/3/8/9 code has a density ratio of 0.89.

For reading data in an MO system, a focused laser beam or other optical device is typically directed at the recording surface of a rotating optical disk such that the laser beam can selectively access one of a plurality of tracks on the recorded surface. The rotation of the laser beam reflected from the recorded surface may be detected by means of Kerr rotation. A change in Kerr rotation of a first type, for example, represents a first binary value. A change in Kerr rotation of a second type represents a second binary value. An output signal is generated from the first and second binary values occurring at specified clock intervals.

Although there has been a continual demand for disk systems capable of storing increasingly higher data densities, the ability to achieve high data storage densities has heretofore been limited by important constraints. In general, several considerations come into play as factors in limiting the data density of a system. These factors have typically focused on cost-quality items, e.g. reliability considerations, the wavelength of the source, the quality of the optical source, and the system's operating speed. Moreover, high data density has often been won only at the cost of giving up the ability to reject various forms of noise, interference, and distortion. For example, when the data is packed at higher densities, intersymbol interference becomes an increasingly significant factor in limiting the accurate detection of data. In addition, manufacturers of many intermediate and high performance optical disk drives have been limited by considerations of maintaining compatibility with earlier models having lower densities. Signal processing techniques have not advanced as rapidly as they might otherwise have.

In existing disk drive systems in magneto-optical and other types of disk drives, read channels in such systems are plagued by problems in reading an input signal which has a significant DC level. One factor which can contribute to a signal exhibiting a DC level is the recording of asymmetric data patterns, i.e. those having a greater number of ones than zeroes over a number of bytes or data segments in the physical medium. A symmetrical data pattern may be considered as one having an average DC level of zero over a region of interest. Sequences of bits as recorded in the physical medium are essentially random for many modulation codes. Therefore, for many localized regions the recorded data will exhibit patterns of 1's and 0's which will be asymmetric and have an unwanted DC component, but because the data patterns vary over time, the level of DC signal component also varies, causing wander of the DC baseline, reduction of threshold detection margins, and greater susceptibility to noise and other interference.

The undesirable DC signal level can also be caused by variation in pit size due to thermal expansion effects in the recording source or the storage medium. When the recording source, e.g. the laser, operates at higher temperatures, the size of the spot focused by the recording source may increase, causing wider pits. When the recorded pits are later read, variations in pit size will result an asymmetric input signal having a DC level. Moreover, the variation in pit size also causes the relative locations of the bits to appear shifted in time with respect to one another thereby reducing the timing margin and leading to possible reading errors.

Various attempts have been made to overcome the described problems. For example, several tape drive systems use a code having no DC level, e.g. the 0/3/8/10 code, otherwise referred to simply as an 8/10 code. An 8/10 code encodes 8 data bits as 10 bits in the physical medium. Therefore, it is only 80% efficient. It is desirable to achieve greater efficiency in order to record at high data densities.

Another system of handling DC signal level components involves the use of double differentiation. This method involves detecting the peaks of a first derivative of the input read signal. Such peaks are detected through detection of zero-crossings of the second derivative of the input read signal. Through double differentiation DC level components do not form a part of the detected data signal; they are effectively filtered out. A drawback of this method is that differentiation or double differentiation can lead to a lowered signal to noise ratio. Another drawback is that the method may decrease the timing margin to unacceptably low levels (i.e. reduction in timing margin may be as much as 50 percent).

In another system the data to be stored is randomized prior to recording such that none of the data patterns repeat over a datasector. However, such a system may not be acceptable to international organizations such as ISO. Moreover, compatibility with earlier disk drive systems may be compromised. A further disadvantage of the system is that de-randomizing the data coming back from the disk involves significant complexity.

Yet another system for reading a signal with significant DC signal components involves the use of so-called resync bytes between data segments. This system generally involves the examination and manipulation of data before it is recorded in order to minimize DC signal components in the recorded medium. Before recording, two consecutive data segments are examined to determine if the patterns of 1's and 0's are such as to exhibit positive DC, negative DC, or no DC level components when read back. If, for example, two consecutive data segments have the same DC polarity, one of the data segments is inverted prior to being recorded on the medium. In order to stay within the constraints of the particular encoding system, however, a resync byte between the segments may need to be recorded so that the pattern of contiguous bits and of flux reversals represents a valid sequence. A disadvantage of this system is that it is not designed to prevent DC signal level components. Moreover, DC signal level components remain such a significant factor that time constants must be calculated such that the DC signal component can be predicted and compensated for so as to not affect performance. Further, the system requires the performance of several additional operations including the examination of data segments to determine their relative polarity.

It would therefore be advantageous to have a system for detecting data stored in a medium without experiencing adverse effects due to DC signal level components, while maintaining a desirable signal-to-noise ratio and simultaneously maintaining timing margins within desirable ranges. The system should function without requiring a significant number of additional operations and avoid the use of a de-randomizing operation while ultimately yielding higher data storage efficiency than heretofore available.

SUMMARY OF THE INVENTION

A system is provided for compensating for DC level components in a data signal emerging from a storage medium such as a magnetic disk, tape, optical disk or magneto-optical disk. In the preferred embodiment, the invention generally comprises the steps of differentiation, equalization, integration of a portion of the signal, threshold generation, and data detection. The steps of differentiation, equalization and integration generally provide a preprocessed signal which corresponds to a playback signal but with better resolution and reduced noise. Data detection further comprises the steps of detecting the positive and negative peaks of the preprocessed signal in a manner so as to compensate for the DC signal component, and generating a threshold corresponding to the midpoint of the measured positive and negative peak values. The method preferably includes the step of feeding back a signal indicative of variations in the duty cycle of the output signal so as to enable tracking of the DC signal component by positive and negative peak detection circuits.

DETAILED DESCRIPTION OF THE SPECIFIC EMBODIMENTS

Although the present invention is applicable to many different data storage and retrieval systems, the following description of the specific embodiments focuses primarily on magneto-optical systems. In so doing, there is no intent to limit the scope of the invention solely to devices which are magneto-optical in nature.

A detailed system for storing and retrieving data from a magneto-optical device is provided in related application Ser. No. 07/964,518 filed Jan. 25, 1993, which is incorporated by reference as if fully set forth herein.

Figure 1:
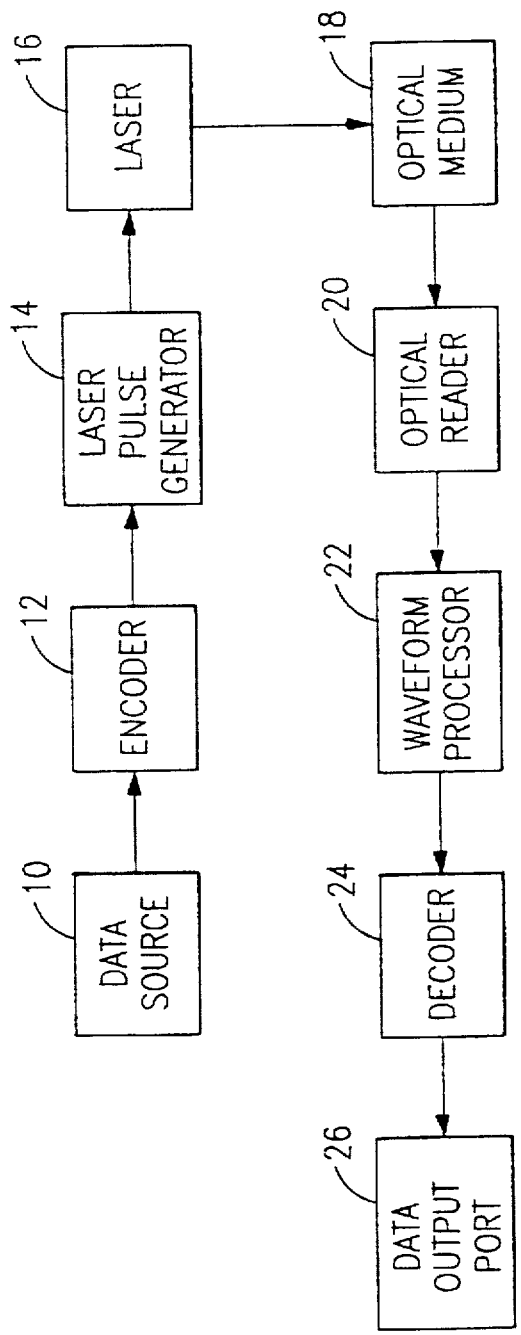
FIG. 1 is a block diagram showing an optical data storage and retrieval system.

A block diagram of an exemplary magneto-optic storage system is shown in FIG. 1. The system has a read mode and a write mode. During the write mode, a data source 10 transmits data to an encoder 12. The encoder 12 converts the data into binary code bits. The binary code bits are transmitted to a laser pulse generator 14, where the code bits are converted to energizing pulses for turning a laser 16 on and off in rapid succession. In one embodiment, for example, a code bit of "1", indicates that the laser will be pulsed on for a fixed duration independent of the code bit pattern, while a code bit of "0" indicates that the laser will not be pulsed during that interval. Depending on the particular laser and type of optical medium being used, performance may be enhanced by adjusting the relative occurrence of the laser pulse or extending the otherwise uniform pulse duration. In response to being pulsed, the laser 16 heats localized areas of an optical medium 18, thereby fixing the magnetic polarity of a localized area of the optical medium 18 in accordance with that of a magnetic flux which flows through the area in the optical medium 18. The localized area, commonly called a "pit", stores the data in the medium in magnetic form until erased.

During the read mode, a laser beam or other light source is shined onto the surface of the optical medium 18. A pickup is appropriately stationed to receive light reflected off the surface of the optical medium 18. The reflected light has a polarization dependent upon the magnetic polarity of the surface of the optical medium 18. The reflected light forms the input into an optical reader 20, which sends an input signal or read signal to a waveform processor 22 for conditioning the input signal and recovering the encoded data. The output of the waveform processor 22 forms the input into a decoder 24. The decoder 24 translates the encoded data into decoded form representative of the original data signal from data source 10. The decoded data is then provided to a data output port 26 for transmission or other processing as desired.

Figure 2:
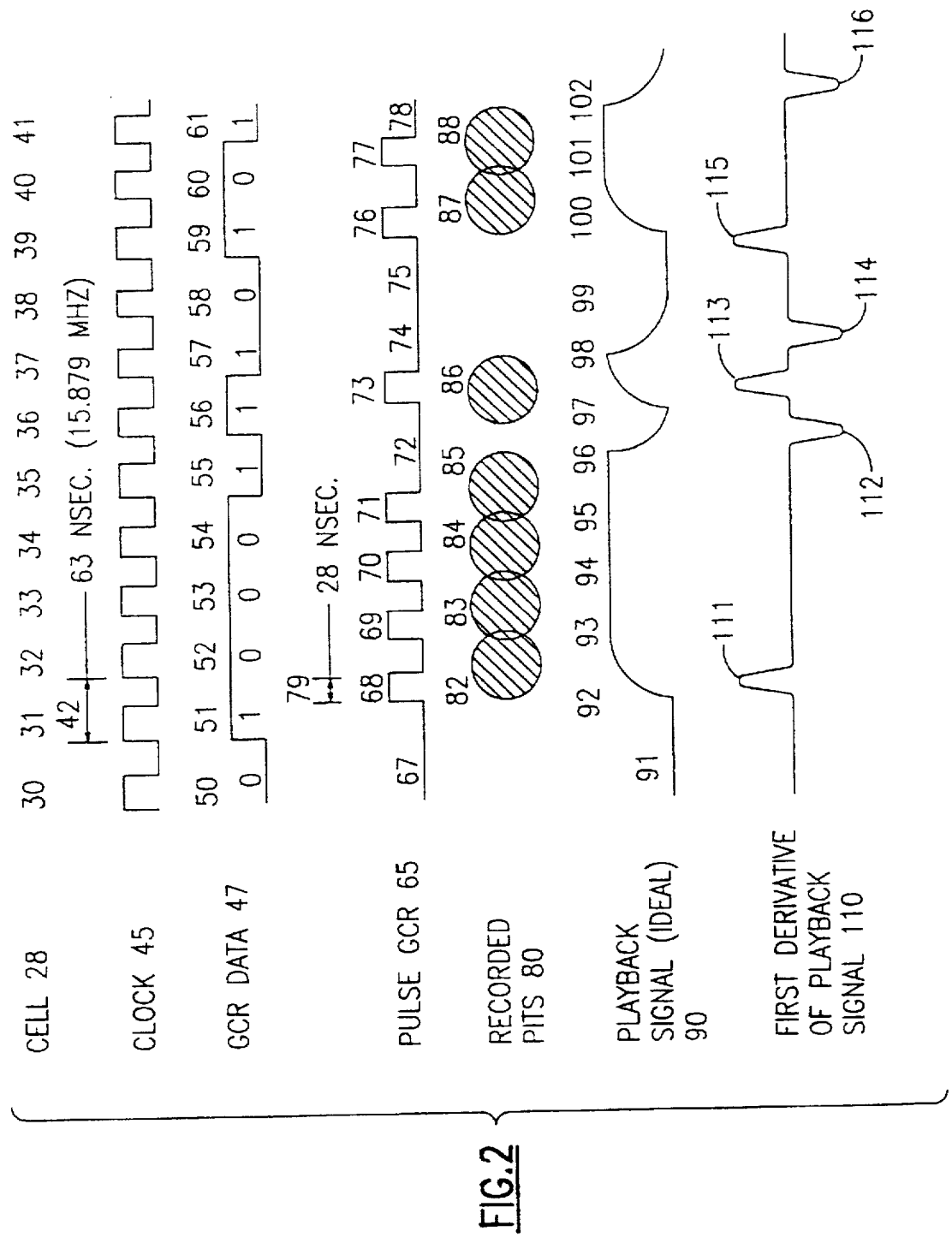
FIG. 2 is a series of sample waveforms associated with a GCR format.

FIG. 2 depicts in more detail the process of data storage and retrieval using a GCR 8/9 code format. For a GCR 8/9 code, a cell 28 is defined as one channel bit. Each clock period 42 corresponds to a channel bit; thus, cells 30 through 41 each correspond to one clock period 42 of clock waveform 45. As an example of clock speeds, for a 3½" optical disk rotating at 2,400 revolutions per minute with a storage capacity of 256 Mbytes, clock period 42 will typically be 63 nanoseconds or a clock frequency of 15.879 Mhz. GCR input waveform 47 is the encoded data output from the encoder 12 (see FIG. 1). The GCR input waveform 47 corresponds to a representative channel sequence "010001110101". The laser pulse generator 14 uses the GCR data waveform 47 to derive the pulse GCR waveform 65 (which in FIG. 2 has not been adjusted in time or duration to reflect performance enhancement for specific data patterns). Generally, the GCR pulses 67 through 78 occur at clock periods when the GCR data waveform 47 is high. The pulse GCR waveform 65 is provided to the laser 16. The magnetization of the optical medium reverses polarity as the laser is pulsed on and off (e.g., by utilizing a non-return-to-zero ("NRZ") driving signal to energize a magnetic recording head). The laser pulses resulting from GCR pulses 68, 69, 70, etc., create a pattern of recorded pits 80 on optical medium 18. Thus, recorded pits 82 through 88 correspond to pulses 68, 69, 70, 71, 73, 76, and 77, respectively.

Successive recorded pits 82 through 85 may merge together to effectively create an elongated pit. The elongated pit has a leading edge corresponding to the leading edge of the first recorded pit 82 and a trailing edge corresponding to the trailing edge of last recorded pit 85.

Reading the recorded pits with an optical device such as a laser results in the generation of a playback signal 90. The playback signal 90, is low in the absence of any recorded pits. At the leading edge of a pit 86, playback signal 90 will rise and remain high until the trailing edge of the pit 86 is reached, at which point the playback signal 90 will decay and remain low until the next pit 87.

The above described process may be referred to as pulse width modulation ("PWM") because the width of the pulses in playback signal 90 indicate the distance between 1-bits. Thus, the edges of the recorded pits 80 which define the length of the pulses in playback signal 90 contain the pertinent data information. If the playback signal is differentiated, the signal peaks 111 through 116 of the first derivative signal 110 will correspond to the edges of the recorded pits 80. (The signal peaks of the first derivative playback signal 110 in FIG. 2 are shown slightly offset from the edges of the recorded pits 80 because an ideal playback signal 90 is shown). In order to recover the pit edge information from the first derivative signal 110, it is necessary to detect the signal peaks 111 through 116. Such a process is described in detail further herein.

In contrast, most if not all existing PLL 2/7 code systems are used in conjunction with pulse position modulation ("PPM"). In PPM systems, each pit represents a "1" while the absence of a pit represents a "0". The distance between pits represents the distance between 1-bits. The center of each pit corresponds to the location of the data. In order to find the pit centers, the playback signal is differentiated and the zero-crossings of the first derivative are detected. Such a technique may be contrasted with PWM systems, described above, in which the signal peaks of the first derivative contain the pertinent pulse width information.

It is nevertheless possible to utilize PWM instead of PPM with an RLL system such as an RLL 2/7 code system. Each channel bit may correspond to a clock period of a clock waveform. As with the GCR system described earlier using PWM, a "1" may be represented by a transition in the input waveform. Thus, the RLL 2/7 input waveform may remain in the same state while a "0" occurs, but changes from high-to-low or low-to-high when a "1" occurs.

In both RLL and GCR codes, as well as other codes, when data patterns are read the input signal generated from the optical reader 20 is often not symmetric, i.e. the input signal does not center around a single point midway between the positive going waveform and the negative going waveform. When an asymmetric signal is AC-coupled between circuits, the average DC value shifts away from the peak-to-peak midpoint. The unintended shifting away from the midpoint may result in a shift in the apparent position of the data; it may also adversely affect the capability of accurately determining the locations of data, or even reduce timing margins and/or render the recorded data unrecoverable.

Figure 3A:
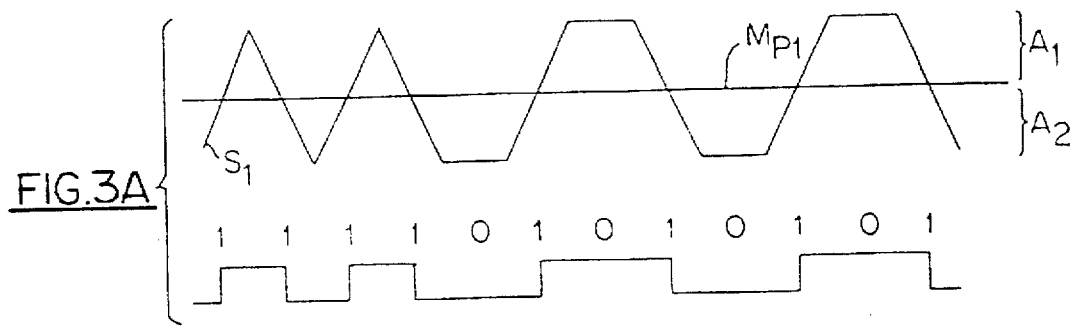
FIGS. 3A and 3B are waveform diagrams of a symmetrical and an asymmetric input signal, respectively.

This phenomenon may be explained with reference to FIGS. 3A and 3B. FIG. 3A shows an ideal input signal $S_1$ derived from a symmetrical data pattern. Normally, transitions between 1's and 0's in the data are detected at the midpoint between high and low peaks of the input signal. It may be observed in FIG. 3A that the areas $A_1$ and $A_2$ above and below the peak-to-peak midpoint $M_{P1}$ of the input signal $S_1$ are equal, and the transitions between 1's and 0's correspond precisely (in an ideal system) to the crossings of the input signal $S_1$ and the peak-to-peak midpoint $M_{P1}$.

Figure 3B:
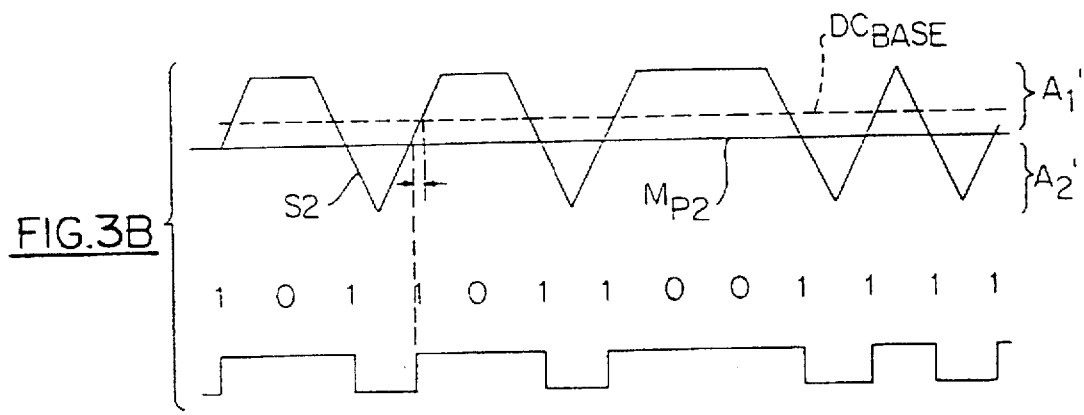

FIG. 3B, in contrast, shows an input signal $S_2$ derived from an asymmetric data pattern. It may be observed that the area $A_1'$ above the peak-to-peak midpoint $M_{P2}$ is greater than the area $A_2'$ below the graph. The input signal $S_2$ therefore has a DC component that shifts the DC baseline $DC_{BASE}$ above the peak-to-peak midpoint $M_{P2}$. When an attempt is made to locate transitions between 1's and 0's by determining the zero-crossings of the input signal $S_2$, errors may be made because the DC level is not identical to the peak-to-peak midpoint $M_{P2}$. The DC level does not stay constant but rises and falls depending on the nature of the input signal. The higher the DC level rises, the more the detected transitions will stray-from the true transition points. Thus, a high DC level in the input signal can cause significant error in the timing of signal transitions and can cause significant error in the detection of data.

Figure 4:
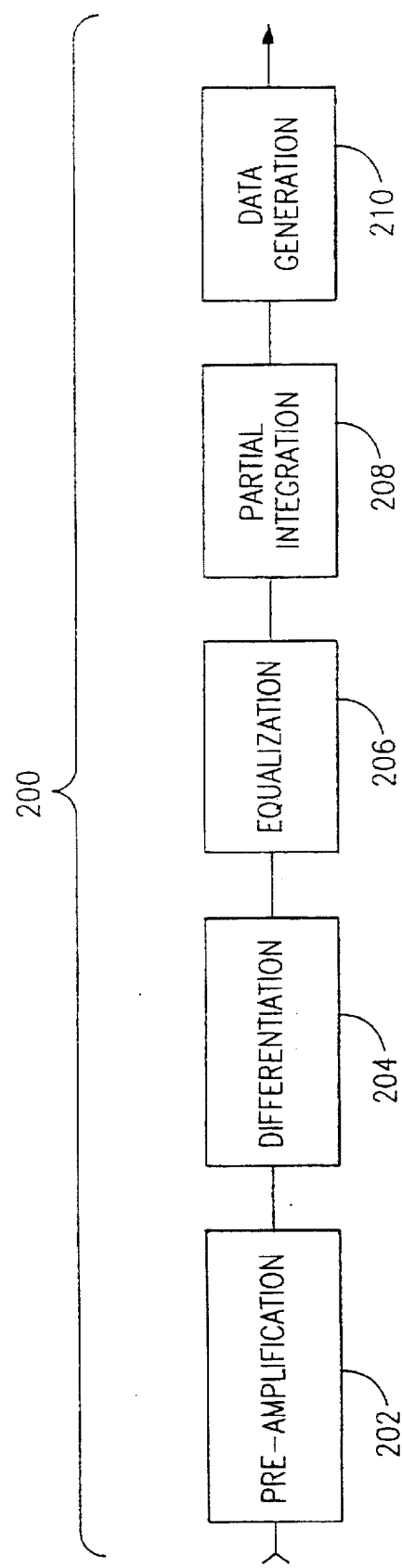
FIG. 4 is a block diagram of a read channel.

FIG. 4 is a block diagram of a read channel 200 in accordance with one embodiment of the present invention for mitigating against DC level signal components. The read channel 200 roughly corresponds to the waveform processor 22 of FIG. 1. The read channel 200 comprises a preamplification stage 202, a differentiation stage 204, an equalization stage 206, an integration stage 208, and a data detection stage 210. The operation of the read channel 200 will be explained with reference to a more detailed block diagram shown in FIG. 5. The waveform diagrams shown in FIGS. 10A–10D, and various other figures as will be referred to from time-to-time herein.

Figure 10A:
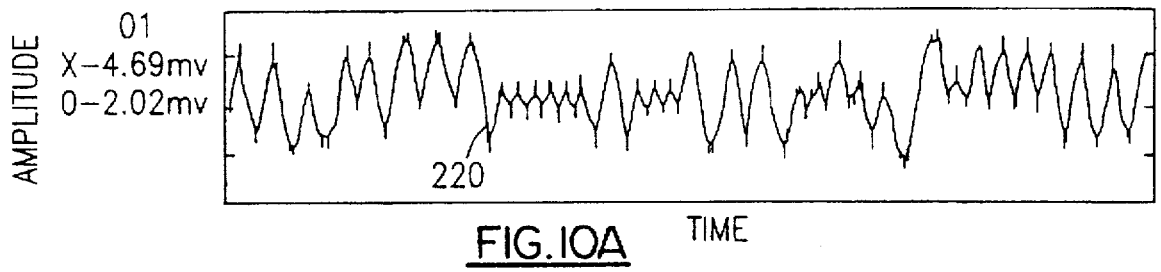
FIGS. 10A–10D are diagrams showing exemplary waveforms at various points in a read channel.

When the optical medium is scanned for data, the pre-amplification stage 202 amplifies the input signal to an appropriate level. The pre-amplification stage 202 comprises a pre-amplifier 203 as is well known in the art. Alternatively, the pre-amplifier 203 may be located elsewhere within another stage of the read channel such as within the optical reader 20. An exemplary amplified playback signal 220 is depicted in FIG. 10A.

Figure 5:
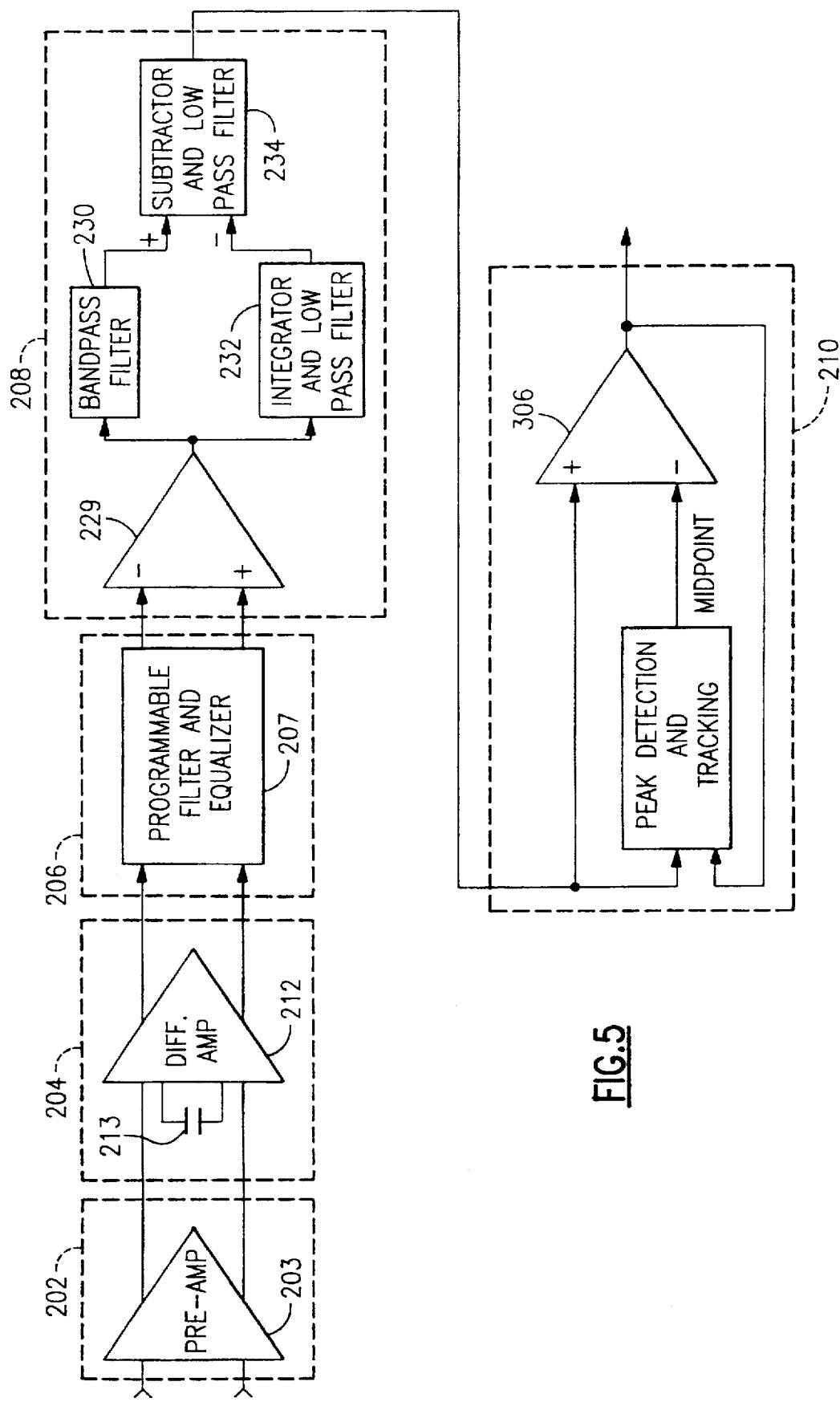
FIG. 5 is a more detailed block diagram of various stages of a read channel.
Figure 6A:
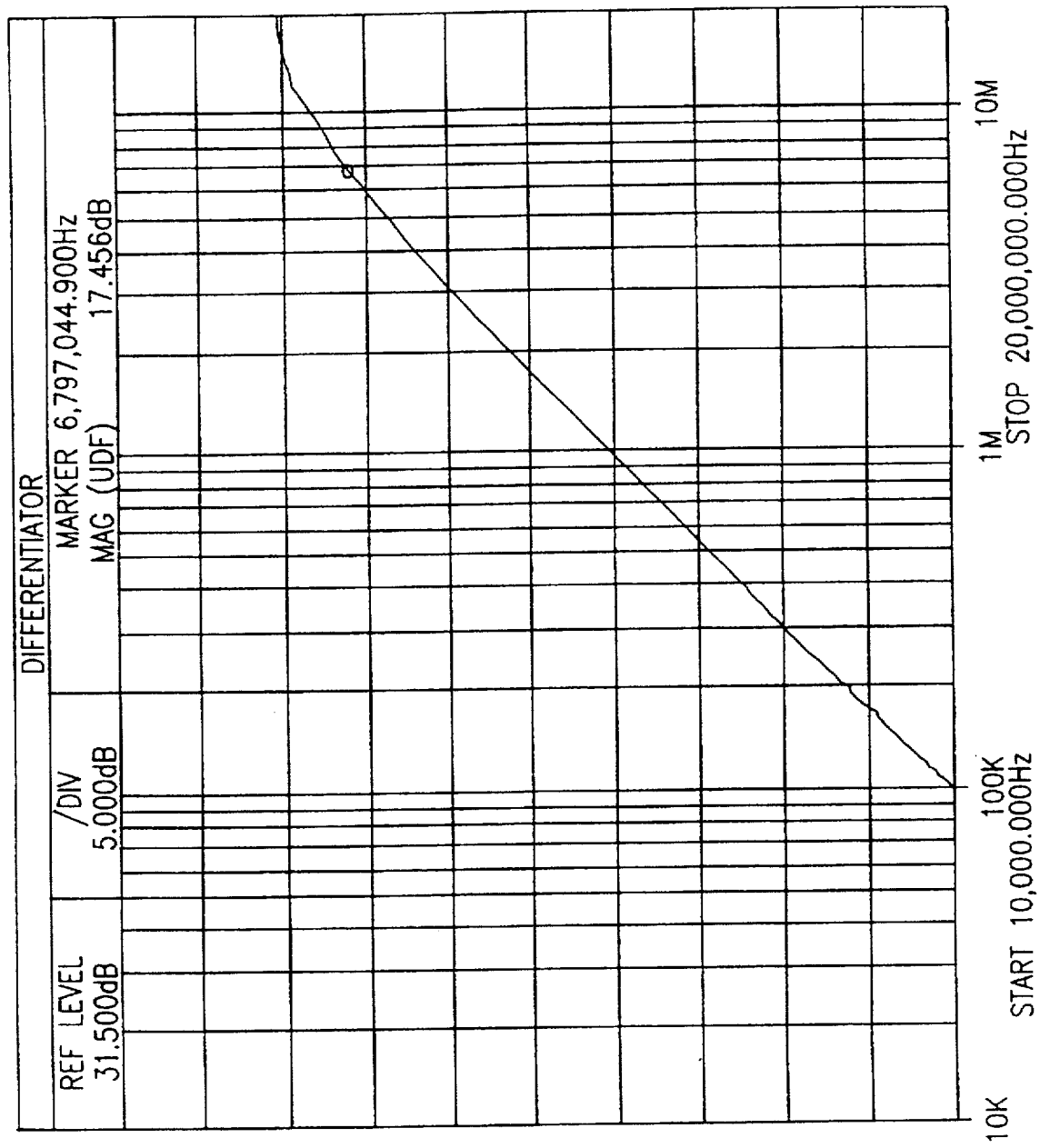
FIGS. 6A–6E are frequency response diagrams of various stages of a read channel.
Figure 10B:
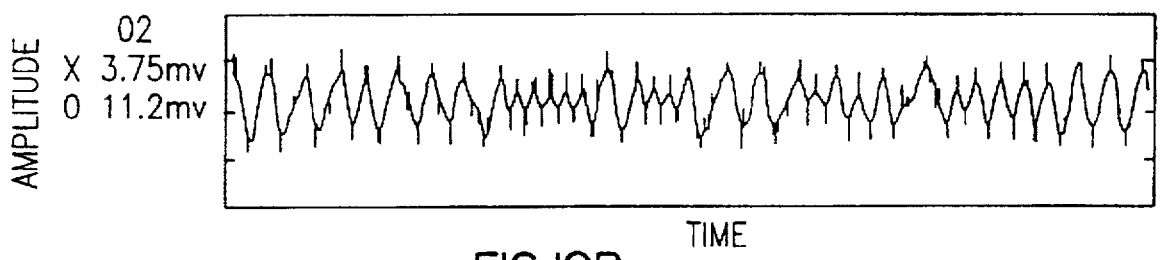

The output of the preamplification stage 202, as shown in FIG. 5, is provided to the differentiation stage 204. The differentiation stage 204 is constructed of a differential amplifier 212 such as a video differential amplifier configured with a capacitor 213 in a manner well known in the art. A representative frequency response diagram of the differentiation stage 204 is shown in FIG. 6A. The differentiation stage 204 effectively increases the relative magnitudes of the high frequency components of the amplified playback signal 220. An exemplary waveform of the output of the differentiation stage 204 is shown in FIG. 10B.

The differentiation stage 204 is followed by an equalization stage 206 as shown in FIG. 5. The equalization stage 206 provides additional filtering so as to modify the overall channel transfer function and provide more reliable data detection. The equalization stage 206 shapes the differentiated input signal so as to even out the amplitudes of high and low frequency components and generate a smoother signal for later processing. However, equalizing filters such as equalization stage 206 often modify the noise spectrum as well as the signal. Thus, an improvement in the shape of the differentiated input signal (i.e., a reduction in distortion) is usually accompanied by a degradation in the signal-to-noise ratio. Consequently, design of the equalization stage 206 involves a compromise between attempting to minimize noise and providing a distortion-free signal at an acceptable hardware cost. In general, equalizer design depends on the amount of intersymbol interference to be compensated, the modulation code, the data recovery technique to be used, the signal-to-noise ratio, and the noise spectrum shape.

Figure 6B:
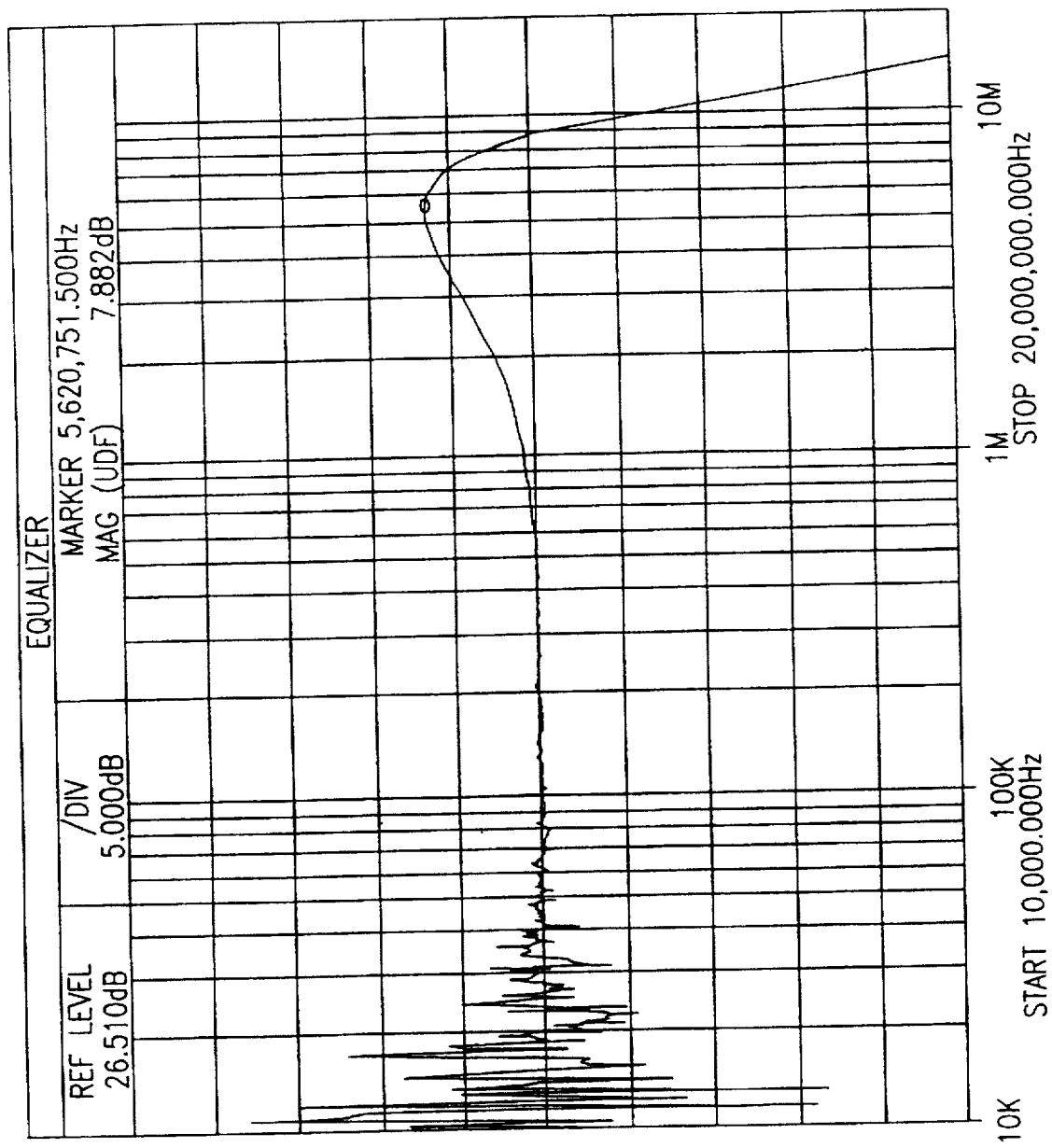

In a preferred embodiment, the equalization stage 206 is constructed of a programmable filter and equalizer 207 located on an integrated chip. Such integrated chips are presently available from various manufacturers. The filter and equalizer 207 preferably have equi-ripple frequency response and have relatively constant group delay up toga frequency equal to about twice the cutoff frequency. Equiripple frequency response occurs when the maxima and the minima are of equal magnitude in each passband. A representative frequency response diagram of the equalization stage 204 is shown in FIG. 6B, and an exemplary output waveform is shown in FIG. 10C.

Figure 10C:
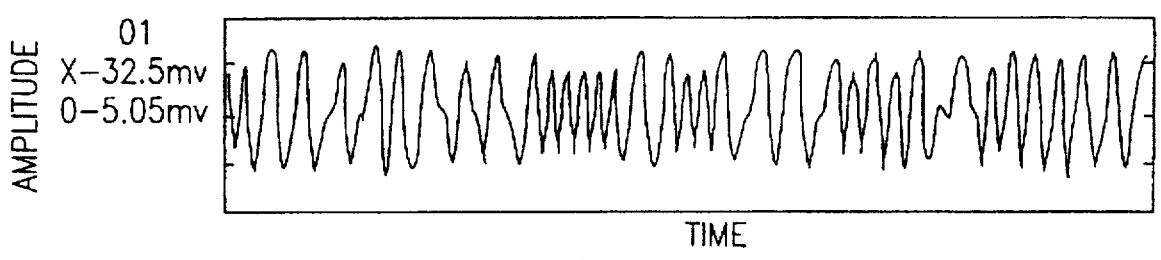

After the signal has been processed by the equalization stage 206, the signal peaks of the waveform in FIG. 10C contain accurate information regarding the position of the read data. The signal peaks can be detected by taking another derivative, but doing so may be detrimental to the system's signal-to-noise ratio and will likely cause undesired jitter. A preferred embodiment of the invention described herein provides an accurate means for detecting the signal peaks without taking a second derivative by integrating a portion of the differentiated read signal and comparing it to the differentiated read signal to obtain a difference signal. The difference signal is then fed to a final detection stage which operates upon the difference signal to detect and transmit binary data pulses for transfer of information.

Figure 6C:
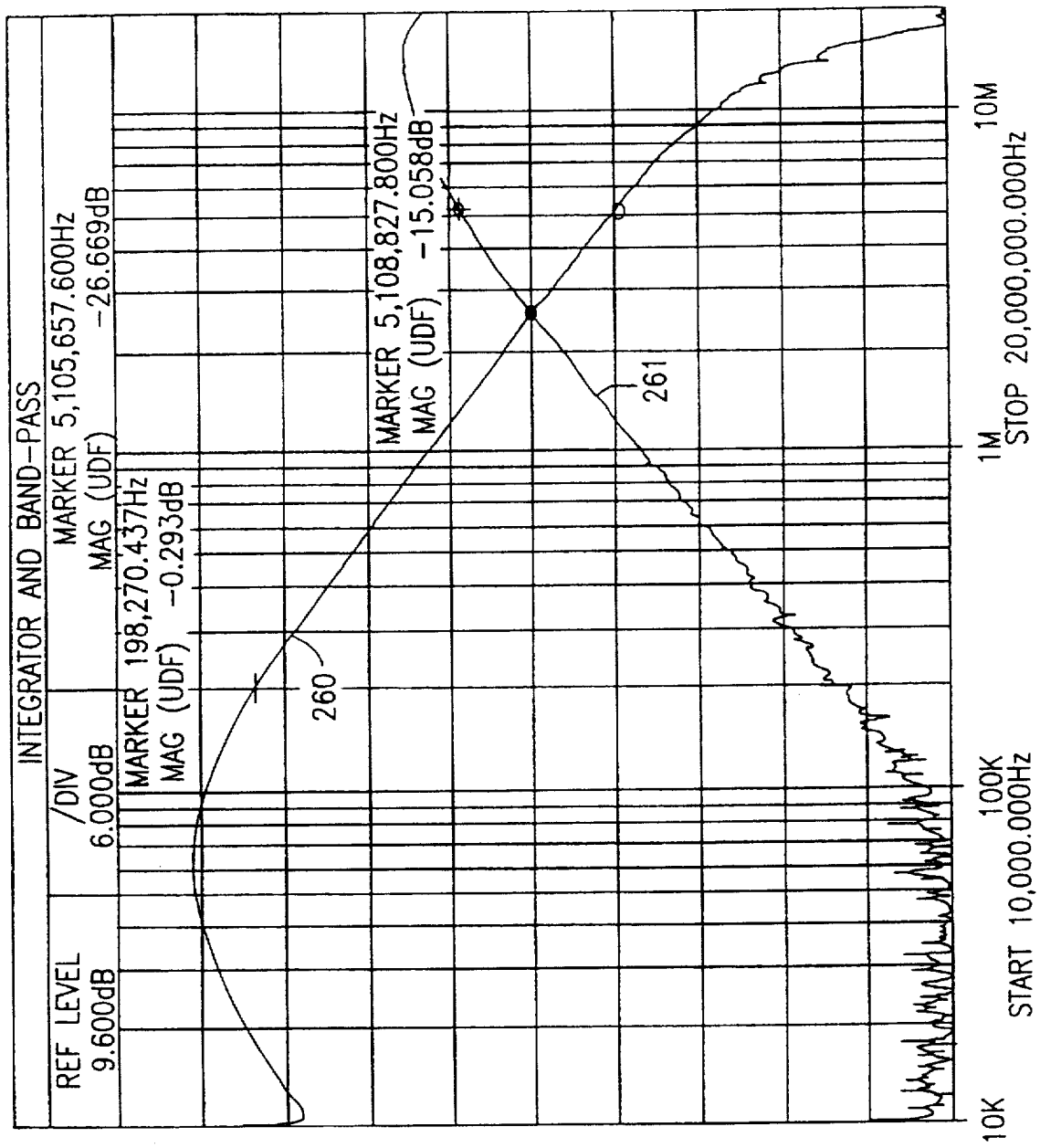
Figure 6D:
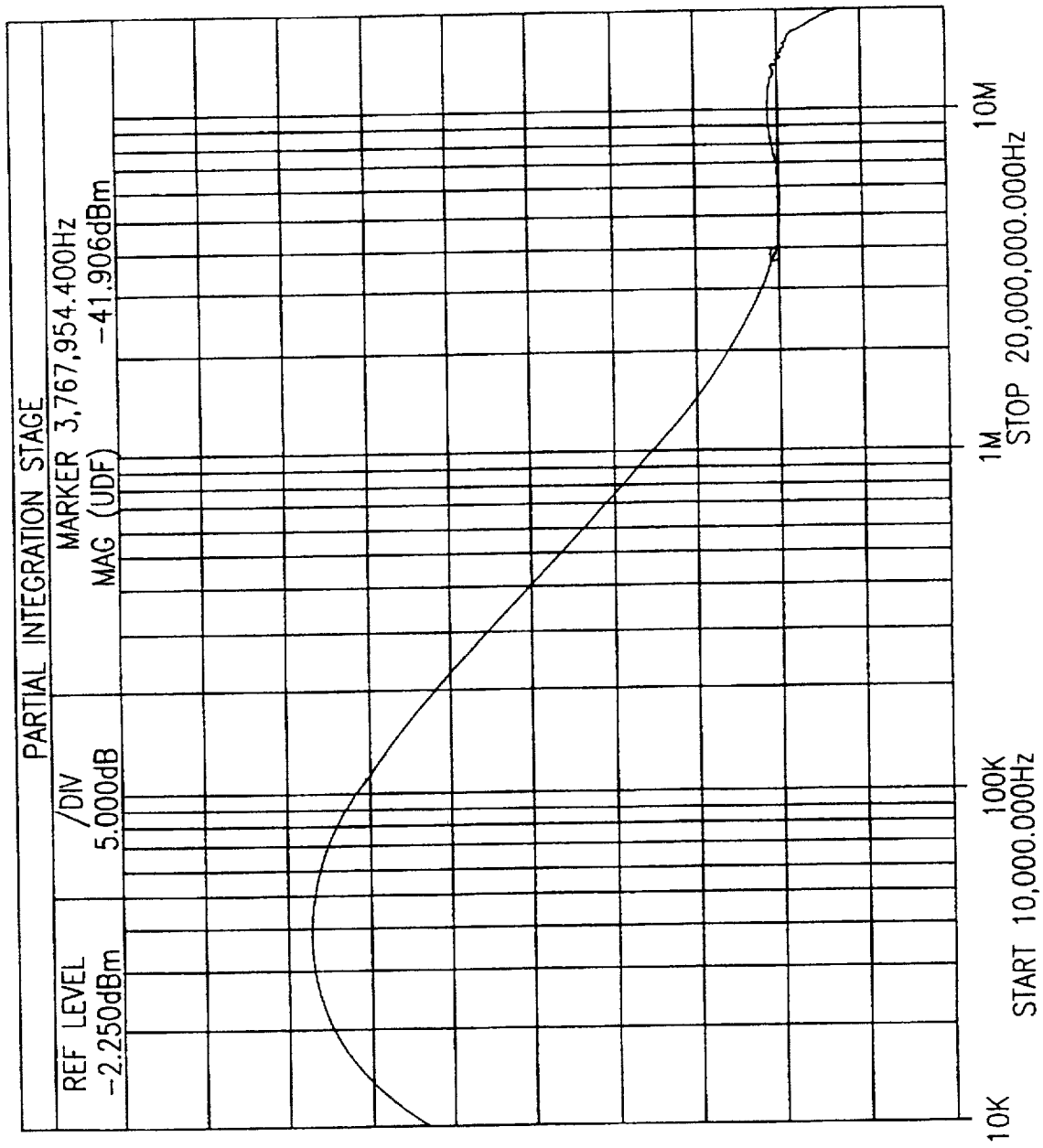
Figure 10D:
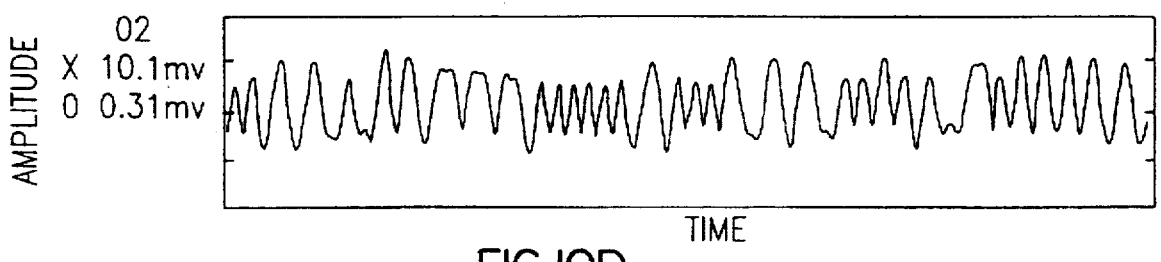

After the signal has been processed by the equalization stage 206, it is provided to an integration stage 208 for further shaping of the waveform. As illustrated in FIG. 5, in the preferred embodiment, the integration stage 208 comprises an amplifier 229, a bandpass filter 230, an integrator 232, and a low pass filter 234. The amplifier 229 receives and amplifies the output of the equalization stage 206. The amplified signal is fed to both the bandpass filter 230 and the integrator 232. The integrator 232 preferably attenuates a selected range of high frequency components. A representative frequency response 260 of the integrator 232 and a representative frequency response 261 of the bandpass filter 230 are depicted in FIG. 6C. The output of the bandpass filter 230 is subtracted from the output of the integrator 232 and filtered by a low pass filter 234. A representative frequency response plot of the integration stage 208, viewed as a whole, between input terminals at the equalization stage 206 and output terminals into data detection stage 210, is shown in FIG. 6D. An exemplary output waveform of the integration stage 208 is shown in FIG. 10D.

Figure 6E:
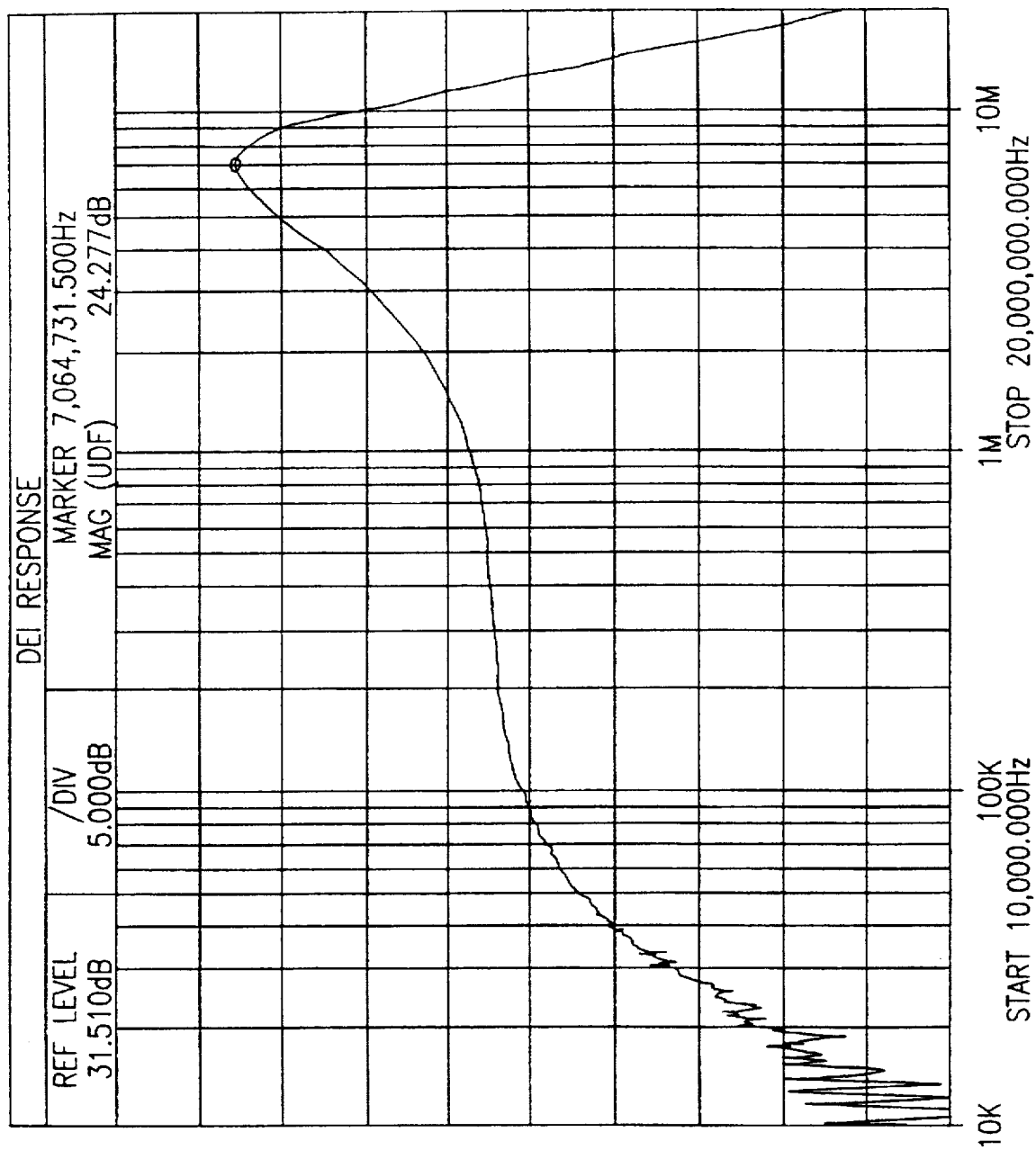

A primary function of the combination of the differentiation stage 204, the equalization stage 206, and the integration stage 208 is to shape the playback signal 220 in an appropriate manner for facilitating data recovery. As can be seen by comparing FIGS. 10A and 10D, the resultant signal shown in FIG. 10D is similar to the playback signal 220 of FIG. 10A (from which it was derived) but differs therefrom in that the amplitudes of its high and low frequency components have been equalized and sharp noise-like characteristics removed. A representative frequency response plot for the combination of the differentiation stage 204, the equalization stage 206, and the integration stage 208 is provided in FIG. 6E.

It may be noted that tape drive systems presently exist which utilize equalization and integration of a playback signal in order to facilitate data recovery. However, these operations are generally performed in such systems for different considerations because most such systems utilize coding formats which do not result in DC signal level components. DC-free codes in systems such as these (i.e. those codes which do not result in DC level signal components) have been found to result in low data density ratio as compared to other coding formats and are therefore inefficient. The present invention allows for the use of more efficient coding systems by compensating for the effects of DC signal level components without having to use DC-free codes.

Figure 9:
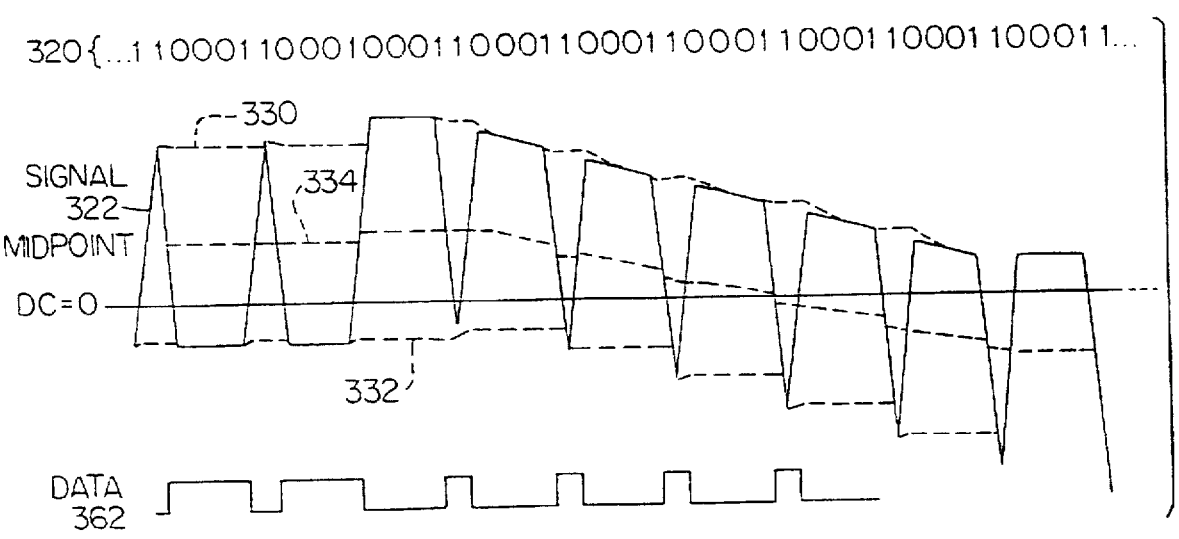
FIG. 9 is a waveform diagram showing tracking by a threshold signal of the DC envelope of an input signal.
Figure 7:
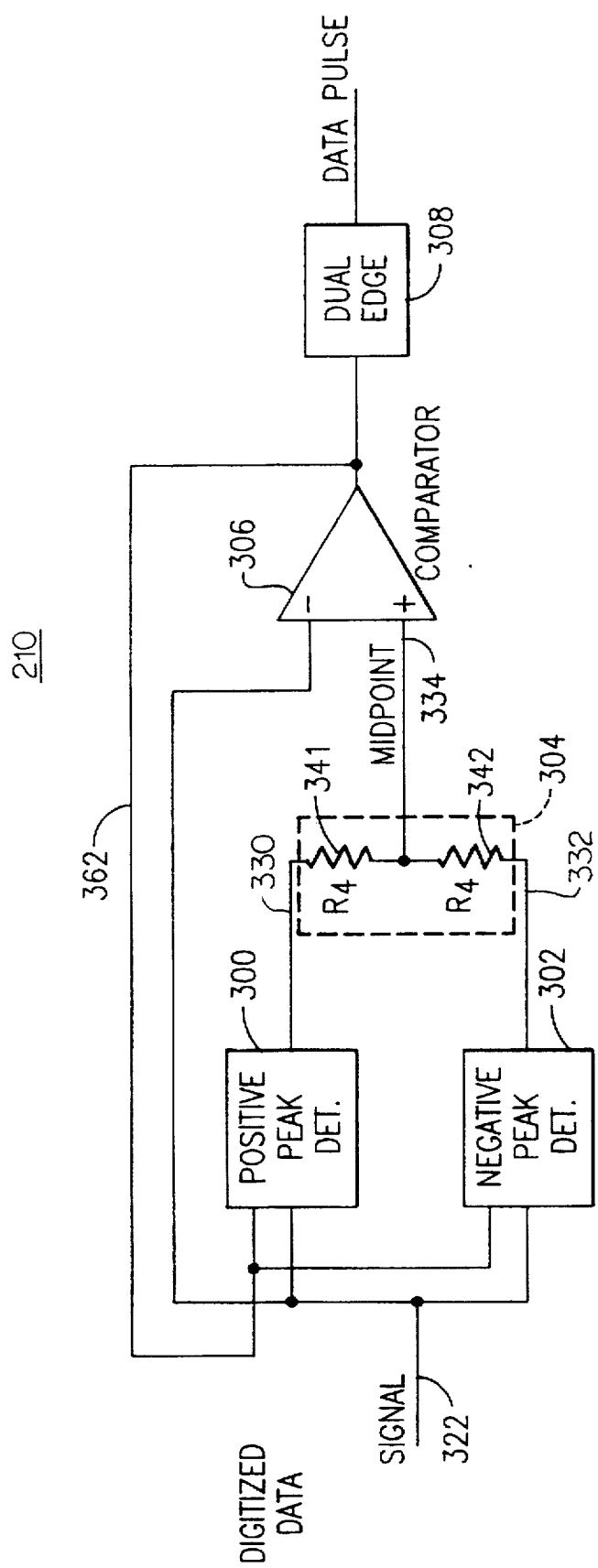
FIG. 7 is a block diagram of a peak detection and tracking circuit.

The output of the integration stage 208 is provided to a data detection stage 210. A block diagram of the data detection stage 210 is shown in FIG. 7. The data detection stage 210 comprises a positive peak detector 300, a negative peak detector 302, a voltage divider 304, a comparator 306, and a dual edge circuit 308. The operation of the circuit shown in FIG. 7 may be explained with reference to FIG. 9. In FIG. 9, it is assumed that a recorded bit sequence 320 has been read and processed through several operations, in the manner as previously described, into a preprocessed signal 322 exiting from an integration stage 208. It should be noted that the preprocessed signal 322 and the various other waveforms described herein have been idealized somewhat for purposes of illustration, and those skilled in the art will appreciate that the actual waveforms may vary in shape and size from those depicted in FIG. 9 and elsewhere.

The preprocessed signal 322 is fed to the positive peak detector 300 and the negative peak detector 302, which measure and track the positive and negative peaks, respectively, of the preprocessed signal 322. The positive peak output signal 330 of the positive peak detector 300 and the negative peak output signal 332 of the negative peak detector 302 are depicted in FIG. 9. The positive peak output signal 330 and the negative peak output signal 332 are averaged by a voltage divider 304. Voltage divider 304 is comprised of a pair of resistors 340 and 341. The output of voltage divider 304 is utilized as a threshold signal 334 and represents the approximate peak-to-peak midpoint of the preprocessed signal 332. The output of the voltage divider 304 is provided to a comparator 306 which compares the divided voltage with the preprocessed signal 332. The comparator 306 changes states when the preprocessed signal 332 crosses the threshold signal 334, indicating a transition in the read data from a 1 to 0 or a 0 to 1. The output of comparator 306 is shown as comparator output waveform 362 in FIG. 9. As will be explained in more detail below, the comparator output waveform 362 is fed back to the positive peak detector 300 and negative peak detector 302 to allow tracking of the DC envelope. The comparator output 362 is also fed to a dual edge circuit 350 which generates a unipolar pulse of fixed duration each time the comparator 306 changes states.

The output of the dual edge circuit 350 provides clocking and data information from which recovery of the recorded data may be had in a straightforward manner. For example, in a pulse-width modulation ("PWM") technique such as the GCR 8/9 modulation code described previously, each data pulse output from the dual edge circuit 350 represents a transition in flux (i.e., a recorded 1-bit), while the lack of data pulse at clock intervals would represent the lack of transition in flux (i.e., a recorded 0-bit). The sequence of recorded bits can thereafter be decoded by decoder 24 (shown in FIG. 1) by methods well known in the art to determine the original data.

Figure 8:
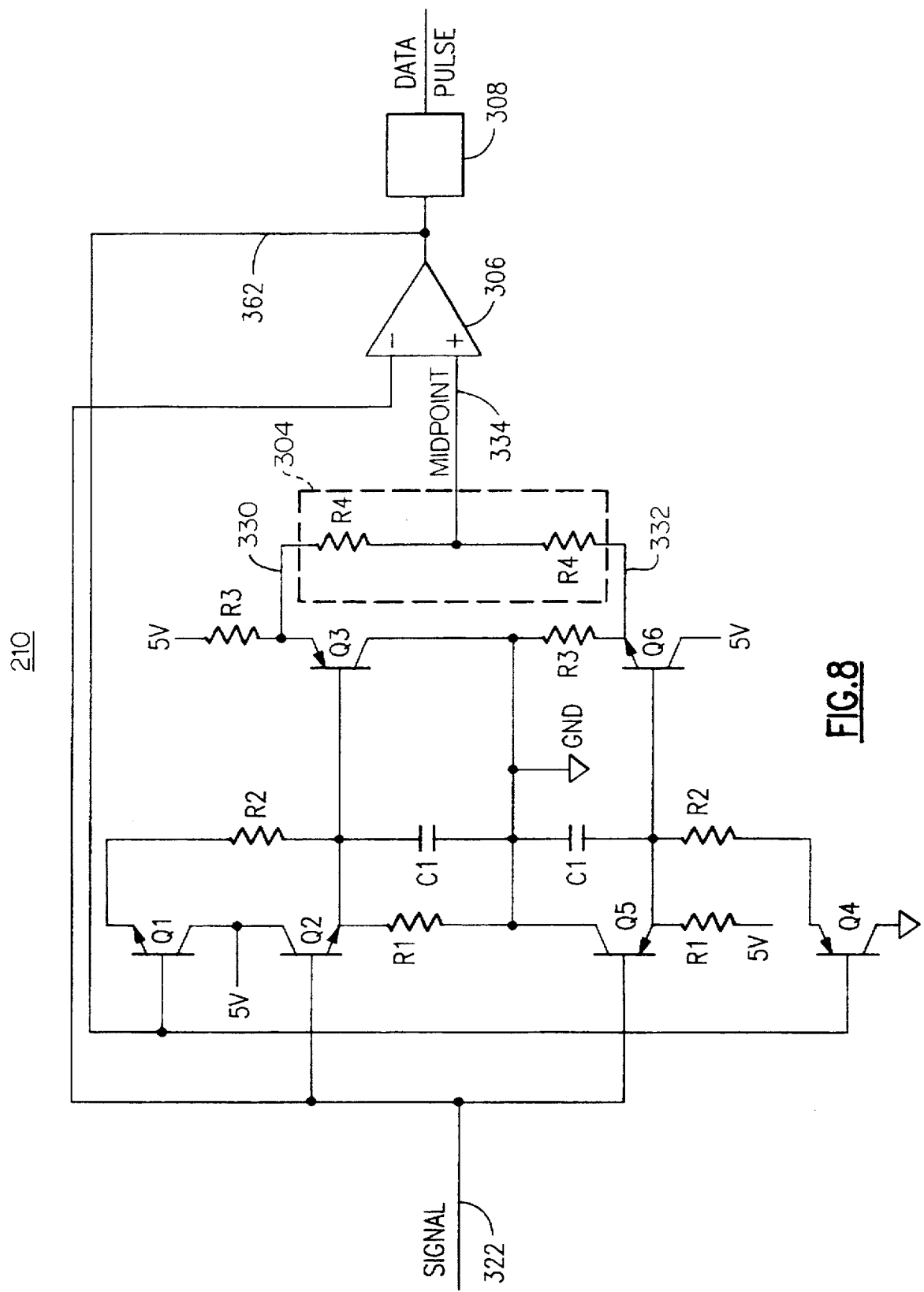
FIG. 8 is a schematic diagram of the peak detection and tracking circuit of FIG. 7.

In order to properly track the envelope caused by the DC portion of the preprocessed signal 322, the preferred embodiment feeds back duty cycle information from the comparator output signal 362 to the positive and negative peak detectors 300 and 302. This process may be explained further by reference to FIG. 8 which depicts a more detailed circuit diagram of the data detection stage 210. As shown in FIG. 8, the preprocessed signal 322 is provided to the base of transistors Q2 and Q5. Transistor Q2 is associated with the positive peak detector 300, and transistor Q5 is associated with the negative peak detector 302. Because the positive peak detector 300 and negative peak detector 302 operate in an analogous fashion, the duty cycle feedback operation will be explained only with reference to the positive peak detector 300, while those skilled in the art will understand by perusal of FIG. 8 and the description below the analogous operation of negative peak detector 302.

Transistor Q2 charges a capacitor C1 when the amplitude of the preprocessed signal 322 exceeds the stored voltage of the capacitor C1 (plus the forward bias voltage of the transistor Q2). In FIG. 9, it can be seen that the positive peak output signal 330 always charges rapidly to the peak of the signal 332. The comparator output signal 362, through feedback, maintains the positive charge on the capacitor C1 when the comparator output signal 362 is high and allows the capacitor C1 to discharge when the comparator output signal 362 is low. Thus, when the comparator output signal 362 is high, the positive charge on capacitor C1 is maintained by transistor Q1 through resistor R2. Preferably, resistors R1 and R2 are selected to be the same value so that charge is added to the capacitor through resistor R2 at the same rate that it is discharged through resistor R1, thus maintaining as constant the net charge on capacitor C1. If, on the other hand, the comparator output signal 362 is low, then transistor Q1 is turned off and capacitor C1 is allowed to discharge though resistor R1. The values of capacitor C1 and resistor R1 are preferably selected such that the time constant is slightly faster than the speed at which the DC signal level is expected to rise so that the capacitor C1 can track the change in DC level as it occurs.

The output of capacitor C1 is provided to the base of transistor Q3. The voltage level of the emitter of transistor Q3 is a bias voltage level above the output of capacitor C1. Current is drawn through resistor R3 which allows the emitter of transistor Q3 to follow the voltage of the capacitor C1 (offset by the emitter-base bias voltage). Thus, the emitter of transistor Q3 yields positive peak output signal 330. It should be noted that transistors Q1 and Q2 are NPN type transistors while Q3 is a PNP type resistor. Thus, the NPN-PNP configuration largely cancels out adverse thermal effects that may be experienced with transistors Q1, Q2 and Q3 and also cancels out the bias voltages associated with their operation.

The negative peak detector 302 operates in an analogous fashion to the positive peak detector 300 and is therefore not explained in greater detail. The emitter of transistor Q6 yields negative peak output signal 332.

As described previously, positive peak output signal 330 and negative peak output signal 332 are averaged by a voltage divider 304 comprised of a pair of resistors R4 as shown in FIG. 8 to form threshold signal 334. The threshold signal 334 therefore constitutes the approximate midpoint of the peak-to-peak value of the preprocessed signal 322 and tracks the DC envelope of the preprocessed signal 322 through duty cycle feedback compensation.

Although the duty cycle feedback has been shown in the preferred embodiment as originating from the output of the comparator 306, it may be observed by those skilled in the art that other feedback paths may be utilized without departing from the spirit and scope of the invention. For example, a similar feedback path may be taken from the output of dual edge circuit 308 if a flip/flop or other memory element is placed at the output of the dual edge circuit 308. Also, other means for measuring duty cycle and adjusting the threshold signal to track the DC envelope may be utilized.

Alternate Embodiments

It will be appreciated that the various circuits and methods described herein are not limited to magneto-optical systems but may also be useful in systems for reading data on stored tapes and other types of disks as well and, in a more general sense, in any system (whether or not a data storage system) for processing electrical signals in which it is desired to mitigate the effects of DC buildup.

While the invention has been particularly shown and described with reference to certain embodiments, it will be understood by those skilled in the art that various changes in form and detail may be made without departing from the spirit and scope of the invention.

What is claimed is:

1. An apparatus for retrieving stored data from an information storage medium, said apparatus comprising:

an input stage for generating a signal having a predetermined waveform including positive and negative peaks corresponding to said stored data;

an integrator stage for integrating at least a portion of said signal to output a preprocessed signal having a predetermined waveform including said positive peaks, negative peaks, and a DC component;

a data generator for generating a threshold signal which varies with said DC component of said preprocessed signal, and for generating an output data waveform signal indicative of said stored data by comparing said preprocessed signal and said threshold signal, said data generator including:

a positive peak detector for receiving said preprocessed signal to measure and track said positive peaks and to output a positive peak signal;

a negative peak detector for receiving said preprocessed signal to measure and track said negative peaks and to output a negative peak signal;

a voltage divider for averaging said negative peak signal and said positive peak signal to thereby generate a voltage divider output; and a comparator for receiving said voltage divider output and comparing said preprocessed signal with a divided voltage corresponding to said threshold signal to thereby generate said output data waveform signal.

2. The apparatus according to claim 1 wherein said information storage medium includes a magneto-optical disk.

3. The apparatus according to claim 1 wherein said input stage includes a scanner for scanning said information storage medium to generate an input signal, and a differentiator for differentiating said input signal.

4. The apparatus according to claim 3 further including an amplifier for amplifying said input signal.

5. The apparatus according to claim 1 wherein said integrator stage includes an integrator for integrating said signal, a band-pass filter for filtering said signal, and a subtractor for generating said preprocessed signal representing the difference between said integrated signal and said band-pass filtered signal.

6. The apparatus according to claim 5 further including a low pass filter for filtering the integrated signal.

7. The apparatus according to claim 6 further comprising a feedback path from said output data waveform signal to the positive and negative peak detectors for adjusting said positive peak signal and said negative peak signal as a function of a predetermined state of said output data waveform signal.

8. The apparatus according to claim 7 wherein said positive peak signal is adjusted by decreasing its magnitude when said output data waveform signal is in alternatively one of a low state and a high state, and said negative peak signal is adjusted by decreasing its magnitude when said output data waveform signal is in the other of said low and high states.

9. The apparatus according to claim 1 wherein said comparator changes states when said preprocessed signal crosses said threshold signal thereby indicating a transition in read data between a 1 and a 0.

10. The apparatus according to claim 1 further including a dual edge circuit for receiving said output data waveform signal from said comparator to generate a unipolar pulse of fixed duration each time said comparator changes states.

11. The apparatus according to claim 10 wherein said dual edge circuit provides clocking and data information from which recovery of the stored data may be obtained.

12. A data generator assembly for use in retrieving stored data from an information storage medium, said data generator circuit comprising:

a positive peak detector for receiving a preprocessed signal having a predetermined waveform including positive peaks, negative peaks, and a DC component, said positive peak detector measuring and tracking said positive peaks to thereby output a positive peak signal;

a negative peak detector for receiving said preprocessed signal, said negative peak detector measuring and tracking said negative peaks to thereby output a negative peak signal;

a voltage divider for averaging said negative peak signal and said positive peak signal, said voltage divider generating a threshold signal representing the approximate peak-to-peak midpoint of the preprocessed signal thereby varying with said DC component;

a comparator for comparing said preprocessed signal with said threshold signal, said comparator generating an output data waveform signal indicative of the stored data on information storage medium; and a feedback loop for applying to said positive peak detector and said negative peak detector a feedback signal representative of a duty cycle of said output data waveform signal thereby compensating for an expected value of said DC component.

13. The data generator assembly according to claim 12 wherein said comparator changes states when said preprocessed signal crosses said threshold signal thereby indicating a transition in read data between a 1 and a 0.

14. The data generator assembly according to claim 12 further including a dual edge circuit for receiving said output data waveform signal from said comparator to generate a unipolar pulse of fixed duration each time said comparator changes states.

15. The data generator assembly according to claim 14 wherein said dual edge circuit provides clocking and data information from which recovery of the stored data may be obtained.

\* \* \* \* \*